United States Patent [19]

Futakuchi

[11] Patent Number: 5,815,053
[45] Date of Patent: Sep. 29, 1998

[54] CERAMIC FILTER VIBRATING IN THE THICKNESS SHEAR-SLIDE MODE WITH ELECTRODE SPACINGS IN THE RANGE OF ONE TO THREE SUBSTRATE THICKNESSES

[75] Inventor: Tomoaki Futakuchi, Nagaokakyo, Japan

[73] Assignee: Murata Manufacturing Co., Ltd., Japan

[21] Appl. No.: 136,969

[22] Filed: Oct. 14, 1993

[30] Foreign Application Priority Data

Oct. 16, 1992 [JP] Japan ................................. 4-305029

[51] Int. Cl.⁶ ........................................................ H03H 9/56
[52] U.S. Cl. ............................. 333/191; 333/192; 310/326; 310/366
[58] Field of Search ................................. 333/187–192; 310/326, 365, 366

[56] References Cited

U.S. PATENT DOCUMENTS 4,066,986  1/1978  Takano et al. ............................ 333/188

FOREIGN PATENT DOCUMENTS

| 0038014 | 3/1983 | Japan | 333/188 |
|---|---|---|---|
| 0029213 | 2/1987 | Japan | 333/187 |
| 0172511 | 7/1988 | Japan | 333/187 |
| 0222308 | 9/1988 | Japan | 333/192 |
| 4004603 | 1/1992 | Japan | 333/191 |

*Primary Examiner*—Benny Lee
*Attorney, Agent, or Firm*—Ostrolenk, Faber, Gerb & Soffen, LLP

[57] ABSTRACT

In an energy trapping type ceramic filter vibrating in the thickness shear-slide mode, vibrating electrodes are formed on opposite sides of a piezoelectric ceramic substrate, while an input terminal electrode and an output terminal electrode are provided on both end portions of the substrate so that lead terminals are soldered to the terminal electrodes. A distance $l_5$ between the input terminal electrode and the adjacent vibrating electrode and a distance $l_6$ between the output terminal electrode and the adjacent vibrating electrode are set within a range of one to three times the thickness of the substrate. Thus, it is possible to suppress undesired vibration other than principal vibration, thereby improving filter characteristics.

8 Claims, 5 Drawing Sheets

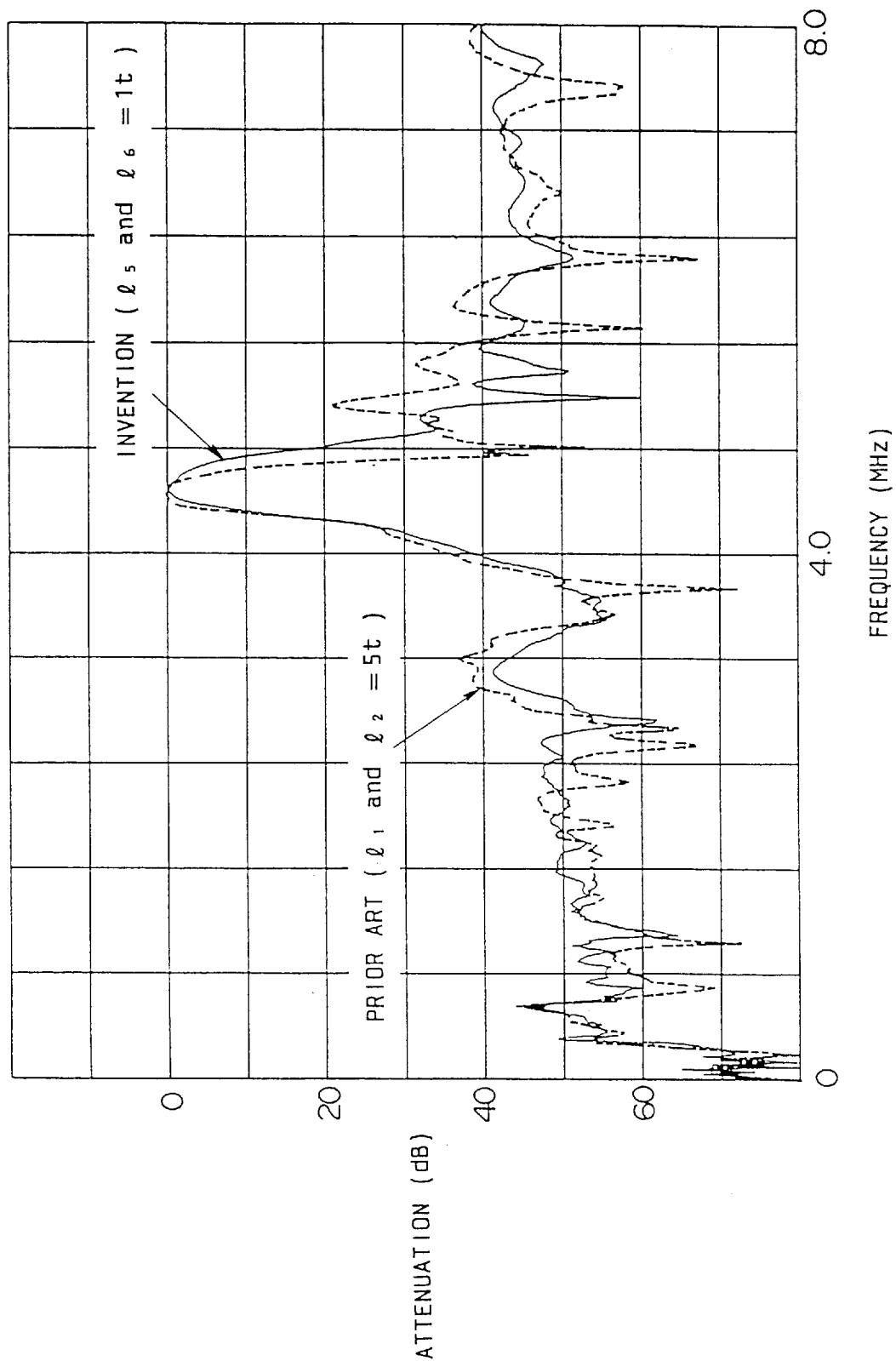

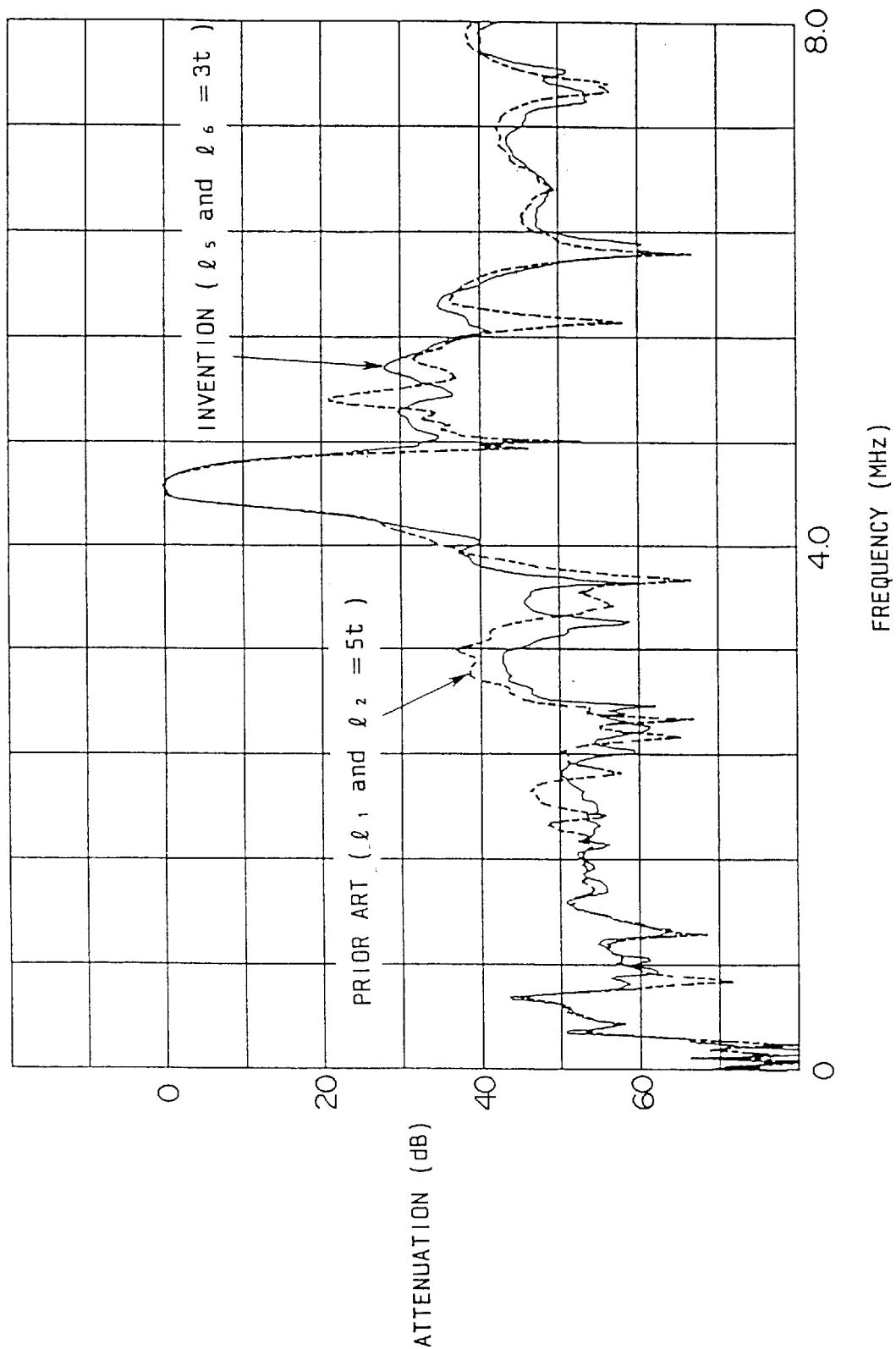

CERAMIC FILTER VIBRATING IN THE THICKNESS SHEAR-SLIDE MODE WITH ELECTRODE SPACINGS IN THE RANGE OF ONE TO THREE SUBSTRATE THICKNESSES

BACKGROUND OF THE INVENTION

The present invention relates to an energy trapping type ceramic filter vibrating in the thickness shear-slide mode, and more particularly, it relates to a ceramic filter which includes a piezoelectric ceramic substrate and a double mode resonator provided thereon.

FIGS. 1 and 2 show a well-known ceramic filter vibrating in the thickness shear-slide mode (TS mode). This ceramic filter comprises an elongated piezoelectric ceramic substrate 1 which is provided on its front surface with an input terminal electrode 2 and an output terminal electrode 2 formed on both end portions and with vibrating electrodes 4 and 5 formed close to a central portion to be connected with the terminal electrodes 2 and 3 through extracting electrodes 16 and 17, respectively. A vibrating electrode 6, which is paired and adjacent to the vibrating electrode 4, and a vibrating electrode 7, which is paired and adjacent to the vibrating electrode 5, are also formed on the front surface of the substrate 1 so that the electrodes 6 and 7 are connected with each other through a extracting electrode 18. The substrate 1 is further provided on its rear surface with a wide vibrating electrode 8 which is opposed to the vibrating electrodes 4 and 6 and another wide vibrating electrode 9 which is opposed to the vibrating electrodes 5 and 7. Both of these vibrating electrodes 8 and 9 are connected with a ground terminal electrode 10, which is formed on a central portion of the rear surface of the substrate 1, through extracting electrodes 19 and 20, respectively.

The electrodes 4, 6 and 8 which are opposed to each other with the substrate 1 therebetween form a double mode resonator $R_1$, while the electrodes 5, 7 and 9 which are also opposed to each other with the substrate 1 therebetween form another double mode resonator $R_2$.

As shown in FIG. 3, lead terminals 11–13 are soldered to the terminal electrodes 2, 3 and 10, respectively. The substrate 1 is covered with a silicon rubber layer 14, and the silicon rubber layer 14 is further covered with a protective resin layer 15.

As shown in FIG. 1, the distance $l_1$ between the input terminal electrode 2 and the vibrating electrode 4, the distance $l_2$ between the output terminal electrode 3 and the vibrating electrode 5, the distance $l_3$ between the ground terminal electrode 10 and the vibrating electrode 8, and the distance $l_4$ between the ground terminal electrode 10 and the vibrating electrode 9 are all formed to have a magnitude equal to to at least 4 to 5 times the thickness of the substrate 1 to accomodate the vibration range of an energy trapping type filter. The reasons for such a design are discussed in the next paragraph.

In an energy trapping type resonator, vibration energy on the vibrating electrode is not outwardly propagated beyond a certain range because resonance frequency on the vibrating electrode is lower than that on a portion without an electrode due to mass loads of electrode materials. In this case, vibration ranges are distributed in such a way that the vibration energy is exponentially attenuated from end surfaces of the electrodes to portions being 4 to 5 times as far as the thickness of the substrate 1. Consequently, the distances $l_1$–$l_4$ are set in the aforementioned manner in order to arrange the solder-damped terminal electrodes in the exterior of the vibration ranges, thereby preventing the vibration energy from being damped.

However, when the distances $l_1$–$l_4$ are set in the aforementioned manner, large responses caused by undesired vibration, such as longitudinal or bending vibration, appear on low and high sides of a principal frequency band in the output waveform of the ceramic filter. When this ceramic filter is applied to TV signal processing, therefore, signals which should be eliminated are leaked in an output signal, to disadvantageously cause waveform distortion in demodulation.

SUMMARY OF THE INVENTION

Accordingly, an object of the present invention is to provide an energy trapping type ceramic filter vibrating in the thickness shear-slide mode, which can suppress undesired vibration for improving filter characteristics.

Another object of the present invention is to provide a ceramic filter which can attain the aforementioned object by only slightly changing the patterns of the electrodes of the conventional filter.

The ceramic filter according to the present invention includes a piezoelectric ceramic substrate, vibrating electrodes which are formed on both surfaces of the substrate and are arranged oppositely to each other with the substrate therebetween, and an input terminal electrode and an output terminal electrode which are provided on both end portions of a front surface of the substrate and a ground terminal electrode which is formed on the central portion of a rear surface of the substrate. The terminal electrodes are connected with external terminals such as lead terminals, for example, by a technique such as soldering. A distance between the input terminal electrode and the adjacent vibrating electrode and a distance between the output terminal electrode and the adjacent vibrating electrode are set to have a magnitude within a range of one to three times the thickness of the substrate.

According to the present invention, the input and the output terminal electrodes are set within a vibration range, so as to attain the following effects:

First, stray capacitance is developed between the input or the output terminal electrode and a ground vibrating electrode which is provided on the rear surface of the substrate, whereby a bottom level of the filter waveform is lowered similarly to a case where a parallel capacitance is added between an input or an output terminal and a ground terminal. In other words, it is possible to attain large attenuation in the frequency band which is to be eliminated.

Second, it is possible to lower a spurious level because undesired vibration which is mixed in principal vibration is damped by solder. Though the principal vibration is also damped in this case as a matter of course and hence filter loss is increased by about 0.5 dB, it is possible to lower the spurious level beyond this amount. However, if the distance between the input or the output terminal electrode and the vibrating electrode is less than the thickness of the substrate, the filter loss is increased so that the filter becomes undesireable. On the other hand, when the distance between the input or the output terminal electrode and the vibrating electrode is greater than a threefold magnitude of the thickness of the substrate, such a filter may not show significant effects in reducing the spurious level as compared with the prior art. According to the present invention, therefore, the distance between the input or the output terminal electrode and the vibrating electrode is set to have a magnitude within the range of one to three times the thickness of the substrate.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 6 to 8 are waveform diagrams of filters of the present invention and a conventional filter.

DESCRIPTION OF THE PREFERRED EMBODIMENTS

Figure 4:
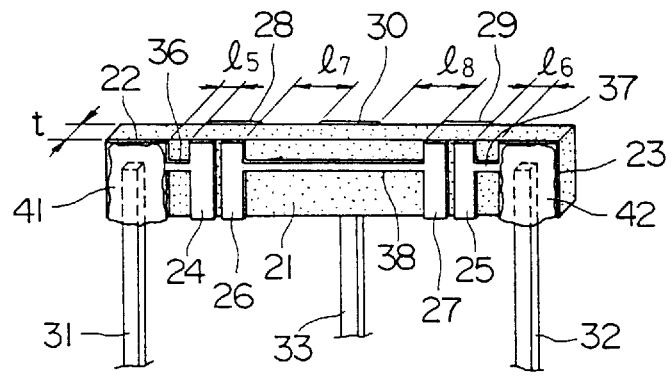
FIG. 4 is a perspective view of a ceramic filter according to an embodiment of the present invention as viewed from a front side.
Figure 5:
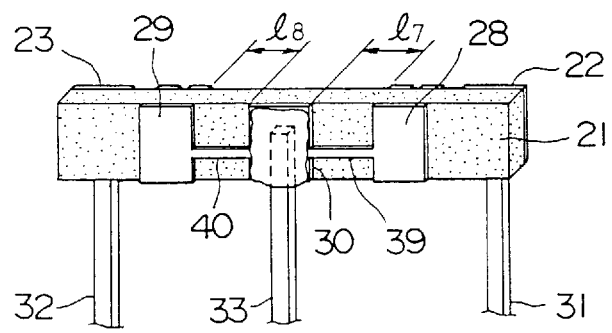
FIG. 5 is a perspective view of the ceramic filter shown in FIG. 4 as viewed from a rear side.

FIGS. 4 and 5 illustrate the structure of a ceramic filter according to an embodiment of the present invention.

Figure 1:
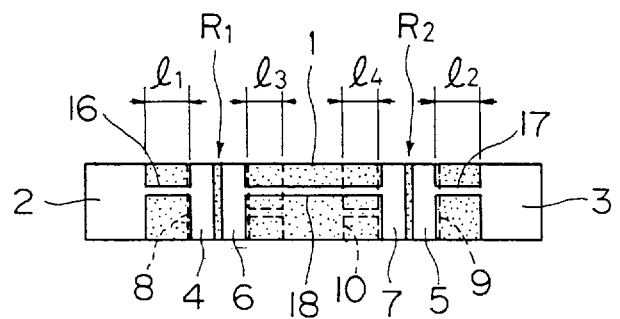
FIG. 1 is a front elevational view showing a conventional ceramic filter element.
Figure 2:
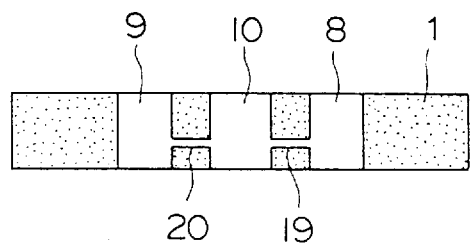
FIG. 2 is a rear elevational view of the ceramic filter element shown in FIG. 1.

Similar to that shown in FIGS. 1 and 2, this ceramic filter comprises a piezoelectric ceramic substrate 21 and two double mode resonators which are provided thereon.

Referring to FIGS. 4 and 5, a substrate 21, terminal electrodes 22, 23 and 30, vibrating electrodes 24–29, extracting electrodes 36–40 and lead terminals 31–33 correspond to the substrate 1, the terminal electrodes 2, 3 and 10, the vibrating electrodes 4–9, the extracting electrodes 16–20 and the lead terminals 11–13 shown in FIGS. 1 and 2, respectively, and hence redundant description is omitted.

Figure 3:
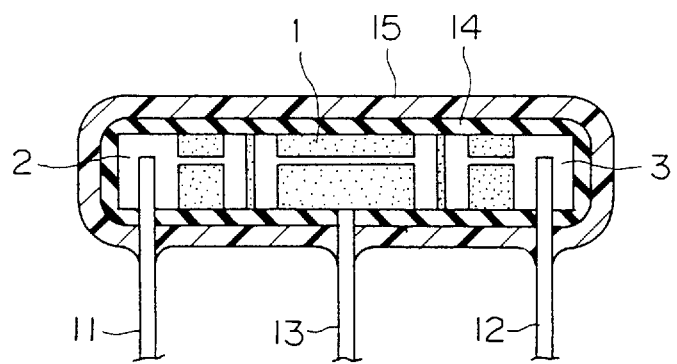
FIG. 3 is a sectional view of a component produced from the ceramic filter element shown in FIG. 1.

Also, referring to FIGS. 4 and 5, the substrate 21 is covered with a silicon rubber layer (not shown), and the silicon rubber layer is further covered with a protective resin layer (not shown), similar to the ceramic filter shown in FIG. 3.

In the ceramic filter shown in FIGS. 4 and 5, the lead terminals 31 and 32 are soldered to the input and the output terminal electrodes 22 and 23, respectively. To improve a vibration damping effect, solder members 41 and 42 are heaped on substantially the entire surfaces of the terminal electrodes 22 and 23. The lead terminal 33 is soldered to the ground terminal electrode 30. The distance $l_5$ is between the input terminal electrode 22 and the vibrating electrode 24 and the distance $l_6$ between the output terminal electrode 23 and the vibrating electrode 25 are set as follows:

$$t \leq l_5 \leq 3t, \quad t \leq l_6 \leq 3t$$

where t represents the thickness of the substrate 21.

The distance $l_5$ between the input terminal electrode 22 and the vibrating electrode 24 and the distance $l_6$ between the output terminal electrode 23 and the vibrating electrode 25 may not necessarily be identical to each other. However, when they are identical to each other, the effect of the present invention is increased and an electrically nonpolarized piezoelectric resonator can be produced. Further, a distance $l_7$ between the ground terminal electrode 30 and the vibrating electrode 28 and a distance $l_8$ between the ground terminal electrode 30 and the vibrating electrode 29 may be identical to or greater than the distances $l_3$ and $l_4$ in a conventional filter.

Figure 6:
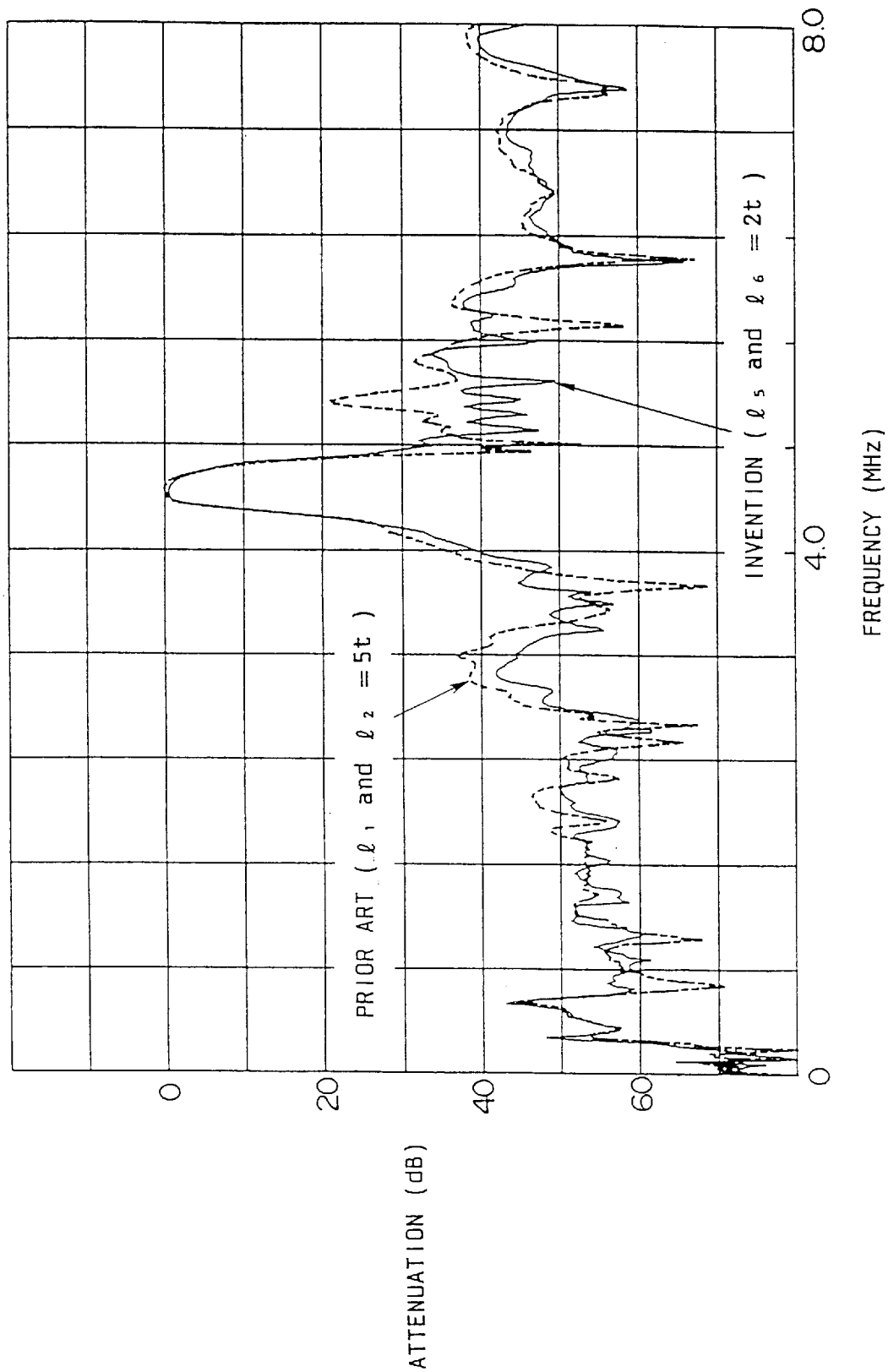

FIG. 6 is a waveform diagram showing comparison of filter waveforms of a conventional filter and a filter of the present invention. In the conventional filter, a distance between an input or an output terminal electrode and a vibrating electrode is five times the thickness of the substrate ($l_1$ and $l_2$=5 t), whereas in the filter of the present invention the corresponding distance is twice the thickness of the substrate ($l_5$ and $l_6$=2 t). Similarly, FIG. 7 is a waveform diagram showing comparison of waveforms of the same conventional filter ($l_1$ and $l_2$=5 t) and another sample of the filter of the present invention ($l_5$ and $l_6$=t), and FIG. 8 is a waveform diagram showing comparison of waveforms of the same conventional filter ($l_1$ and $l_2$=5 t) and still another sample of the filter of the present invention ($l_5$ and $l_6$=3 t). In every case, the substrate 21 has a thickness t of 220 μm.

It is apparent from these waveform diagrams that the responses made by the conventional filter ($l_1$ and $l_2$=5 t) and the filters of the present invention ($l_5$ and $l_6$=t to 3 t) are substantially identical in principal vibration (4.5 MHz), while responses made on low and high sides caused by undesired vibration are reduced by about 10 dB in the filters of the present invention as compared with the conventional filter. Therefore, when the filter of the present invention is applied to a band pass filter for a TV signal processing circuit, it is possible to reliably prevent an undesirable frequency from passing, whereby waveform distortion can be suppressed in demodulation.

These diagrams also show that among those three filters of the present invention, a most preferable filter waveform is obtained in the case where $l_5$ and $l_6$ are set to be 2 t ($l_5$ and $l_6$=2 t) as compared with the remaining cases.

Figure 9:
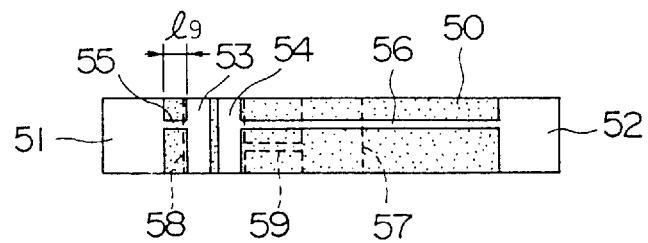
FIG. 9 is a front elevational view showing a ceramic filter element according to another embodiment of the present invention.

FIG. 9 shows a ceramic filter according to another embodiment of the present invention, which comprises only one double mode resonator provided on the substrate. In this case also, an effect similar to that of the aforementioned embodiment can be attained. Referring to FIG. 9, the ceramic filter comprises a piezoelectric ceramic substrate 50, an input terminal electrode 51 and an output terminal electrode 52, vibrating electrodes 53 and 54, extracting electrodes 55 and 56, a ground terminal electrode 57, a ground vibrating electrode 58 and an extracting electrode 59.

In this ceramic filter, because the vibrating electrodes 53 and 54 are provided on positions closer to the input terminal electrode 51, a distance $l_9$ between the input terminal electrode 51 and the vibrating electrode 53 may be set within a range of one to three times the thickness of the substrate 50.

Alternatively, the vibrating electrodes 53 and 54 may be provided on positions closer to the output terminal electrode 52, to attain a similar effect.

The present invention is not restricted to a radial lead type ceramic filter as described above with reference to each embodiment. Alternatively, the present invention can be applied to a chip type ceramic filter which is well known to those skilled in the art.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An energy trapping type ceramic filter vibrating in a thickness shear-slide mode, said ceramic filter comprising:

an elongated piezoelectric ceramic substrate having a front major surface and a rear major surface;

first and second terminal electrodes formed on end portions of said front major surface of said substrate;

a third terminal electrode formed at a central position on said rear major surface of said substrate;

first and second vibrating electrodes adjacently formed on said front major surface of said substrate in intermediate positions between said first terminal electrode and a portion opposite to said third terminal electrode;

third and fourth vibrating electrodes adjacently formed on said front major surface of said substrate in intermediate positions between said second terminal electrode and a portion opposite to said third terminal electrode;

a fifth vibrating electrode formed on said rear major surface of said substrate in a position opposite to said first and second vibrating electrodes;

a sixth vibrating electrode formed on said rear major surface of said substrate in a position opposite to said third and fourth vibrating electrodes;

a first extracting electrode formed on said front major surface of said substrate for connecting said first terminal electrode with said first vibrating electrode;

a second extracting electrode formed on said front major surface of said substrate for connecting said second terminal electrode with said fourth vibrating electrode;

a third extracting electrode formed on said front major surface of said substrate for connecting said second and third vibrating electrodes with each other;

a fourth extracting electrode formed on said rear major surface of said substrate for connecting said third terminal electrode with said fifth vibrating electrode; and a fifth extracting electrode formed on said rear major surface of said substrate for connecting said third terminal electrode with said sixth vibrating electrode; wherein a distance $l_5$ between said first terminal electrode and said first vibrating electrode located adjacent to said first terminal electrode is set within a range of one to three times a magnitude of a thickness of said substrate and a distance $l_6$ between said second terminal electrode and said fourth vibrating electrode located adjacent to said second terminal electrode is set within a range of one to three times a magnitude of a thickness of said substrate.

2. A ceramic filter in accordance with claim 1, wherein a lead terminal is soldered to each of said first, second and third terminal electrodes.

3. A ceramic filter in accordance with claim 2, wherein said substrate is covered with a silicon rubber layer, and said silicon rubber layer is further covered with protective resin.

4. A ceramic filter in accordance with claim 1, wherein said distance $l_5$ between said first terminal electrode and said first vibrating electrode is set to be substantially twice the magnitude of the thickness of said substrate and wherein said distance $l_6$ between said second terminal electrode and said fourth vibrating electrode is set to be substantially twice the magnitude of the thickness of said substrate.

5. An energy trapping type ceramic filter vibrating in a thickness shear-slide mode, said ceramic filter comprising:

an elongated piezoelectric ceramic substrate having a front major surface and a rear major surface;

first and second terminal electrodes formed on end portions of said front major surface of said substrate;

a third terminal electrode formed at an intermediate position on said rear major surface of said substrate;

first and second vibrating electrodes adjacently formed on said front major surface of said substrate in intermediate positions between said first terminal electrode and a portion opposite to said third terminal electrode;

a third vibrating electrode formed on said rear major surface of said substrate in a position opposite to said first and second vibrating electrodes; and a first extracting electrode formed on said front major surface of said substrate for connecting said first terminal electrode with said first vibrating electrode;

a second extracting electrode formed on said front major surface of said substrate for connecting said second terminal electrode with said fourth vibrating electrode;

a third extracting electrode formed on said rear major surface of said substrate for connecting said third terminal electrode and said third vibrating electrode; wherein a distance $l_9$ between said first terminal electrode and said first vibrating electrode located adjacent to said first terminal electrode is set within a range of one to three times a magnitude of a thickness of aid substrate.

6. A ceramic filter in accordance with claim 5, wherein a lead terminal is soldered to said each of said first, second and third terminal electrodes.

7. A ceramic filter in accordance with claim 6, wherein said substrate is covered with a silicon rubber layer, and said silicon rubber layer is covered with protective resin.

8. A ceramic filter in accordance with claim 5, wherein said distance $l_9$ between said first terminal electrode and said first vibrating electrode is set to be substantially twice the magnitude of the thickness of said substrate.

* * * * *